United States Patent
Shu et al.

(12)

(10) Patent No.: US 6,383,933 B1
(45) Date of Patent: May 7, 2002

(54) METHOD OF USING ORGANIC MATERIAL TO ENHANCE STI PLANARIZATION OR OTHER PLANARIZATION PROCESSES

(75) Inventors: Jen Shu, Saratoga; Michael E. Thomas, Milpitas; Prochy Sethna, San Jose, all of CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/534,147

(22) Filed: Mar. 23, 2000
(Under 37 CFR 1.47)

(51) Int. Cl.[7] .............................................. H01L 21/00
(52) U.S. Cl. ......................... 438/692; 216/38; 216/88; 438/745
(58) Field of Search ................................. 438/690, 691, 438/692, 693, 745, 756, 757; 216/38, 88, 89, 91, 99; 156/345 LP (56) References Cited

U.S. PATENT DOCUMENTS

| | | | |
|---|---|---|---|
| 5,665,202 A | * | 9/1997 | Subramanian et al. .... 216/88 X |
| 5,961,794 A | * | 10/1999 | Morita ..................... 216/38 X |
| 6,251,788 B1 | * | 6/2001 | Liou ....................... 438/692 X |

* cited by examiner

Primary Examiner—William A. Powell
(74) Attorney, Agent, or Firm—Stallman & Pollock LLP (57) ABSTRACT

A planarization process in which an organic film prevents oxide dishing during the chemical mechanical polishing step. In the planarization process an organic film having high CMP selectivity to silicon dioxide is spun over silicon dioxide. A patterned mask is then placed over the organic film and the exposed portions of the organic film are etched away. The remaining portions of the organic film prevent oxide dishing during chemical mechanical polishing because the high CMP selectivity of the organic film to silicon dioxide stops the etching before oxide dishing occurs. The organic film may then be oxygen ashed off the planarized surface if so desired.

50 Claims, 6 Drawing Sheets

METHOD OF USING ORGANIC MATERIAL TO ENHANCE STI PLANARIZATION OR OTHER PLANARIZATION PROCESSES

BACKGROUND OF THE INVENTION

1. Field of the Invention

The present invention relates to the manufacture of integrated circuit structures and, in particular, to a planarization process that uses organic material to enhance shallow trench isolation (STI) planarization, or other planarization processes, in integrated circuit manufacturing by preventing oxide dishing during chemical mechanical polishing (CMP).

2. Description of Related Art

The advancement in complexity of integrated circuit structures has led to the requirement of more layers formed on the silicon substrate surface. The additional layers result in an uneven topography. The uneven topography affects lithographic depth of focus, which negatively impacts the resolution of small image sizes in the photolithographic techniques used in manufacturing integrated circuits.

Planarization processes are used to planarize, or flatten, the topography of the substrate surface. Chemical mechanical polishing (CMP) is a planarization technique that is used to create a flat surface. However, CMP planarization results in oxide dishing in large areas between fine features. Oxide dishing is a problem because it has a negative impact on electrical isolation, etch uniformity in subsequent processing, and pattern definition.

Figure 1:
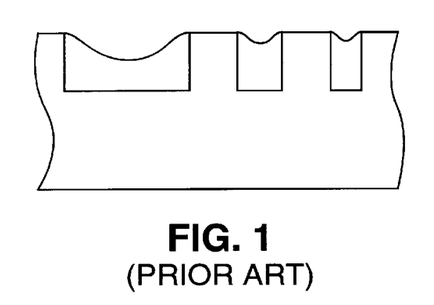
FIG. 1 is a cross-sectional view of oxide dishing in a structure having uneven topography after chemical mechanical planarization.

Oxide dishing occurs when local portions of the surface of the structure are polished too much during the CMP step, resulting in depressed areas in the surface. In CMP, a rotating polishing pad polishes the surface of the structure to remove the excess oxide. The areas between features, especially wide features, are prone to oxide dishing because the larger depressed areas are also polished by the rotating polishing pad. FIG. 1 illustrates the problem of oxide dishing in a structure having uneven topography after CMP planarization.

Shallow trench isolation (STI) is a technique for isolating active devices in high density integrated circuits. Integrated circuit manufacturers have, until recently, avoided STI because STI, when compared with other device isolation processes, is complex. STI requires more process control than the commonly used local oxidation of silicon (LOCOS) isolation. However, with the increasing need for higher device density, STI is becoming more widely utilized since it encroaches less in the active area of the device.

One difficulty in implementing STI has been that, without reactive ion etching (RIE) etch back processing, CMP planarization has been unable to adequately planarize the substrate surface due to the large feature density variations on the device surface which leads to the above-described oxide dishing problem. In the past, RIE etch back was used to generate artificial topography in oxide to form features on the wafer. The RIE etch back adds to the complexity of the STI process because it requires an additional photolithography step to form a resist block as well as the RIE etch back step.

Slurry manufacturers have been trying to eliminate the need for RIE etch back processing by looking for materials that improve the typical 5:1 removal rate selectivity of oxide to nitride to values greater than 20:1 to solve the oxide dishing problem. However, an ideal slurry has not yet been discovered.

SUMMARY OF THE INVENTION

The present invention provides a planarization process that is enhanced by an organic material having a high CMP selectivity to silicon dioxide. The high CMP selectivity of the organic material prevents the oxide dishing which normally occurs during chemical mechanical polishing.

In accordance with the invention, silicon dioxide is formed over a structure having uneven topography. A thin layer of organic material is then formed over the silicon dioxide. A patterned masking material is then formed over the organic material and the exposed portions of the organic material are etched, stopping on the oxide. The masking material is patterned such that it masks the areas prone to oxide dishing, thereby leaving the organic material in those areas.

The masking material is then stripped away, leaving exposed surfaces of the organic material and of silicon dioxide. The structure is then polished, utilizing CMP, to planarize the surface. The organic material may then be removed with a highly selective oxygen plasma or is left on the wafer surface as part of the dielectric. Given the thinness of the layer of the organic material, the surface of the structure is still substantially planarized after removal of the organic material. The organic material, being non-etchable by CMP and its high selectivity to silicon dioxide, stops the etching during the polishing step and thereby prevents oxide dishing.

The organic material stops the etching because organics have high selectivity to silicon dioxide because it appears that the organic material cannot be chemically damaged and mechanically removed by the slurry. It appears that organics have almost infinite selectivity to silicon dioxide in silicon dioxide polish slurries. This high selectivity prevents the organic material from being polished by the slurries.

The organic material eliminates the oxide dishing problem that generally occurs during the CMP step in STI planarization. In multilevel metalization processes, the organic material solves the dishing problem as well in large open areas greater than 20 μm between metal features.

BRIEF DESCRIPTION OF THE DRAWINGS

The invention will be better understood by reference to the attached figures in which.

DETAILED DESCRIPTION OF THE INVENTION

The invention will be described in detail with reference to FIGS. 2–21. The invention is a process for planarizing a structure having an uneven topography. A cross-section of a structure having an uneven topography 7 is shown in FIG. 3.

Figure 2:
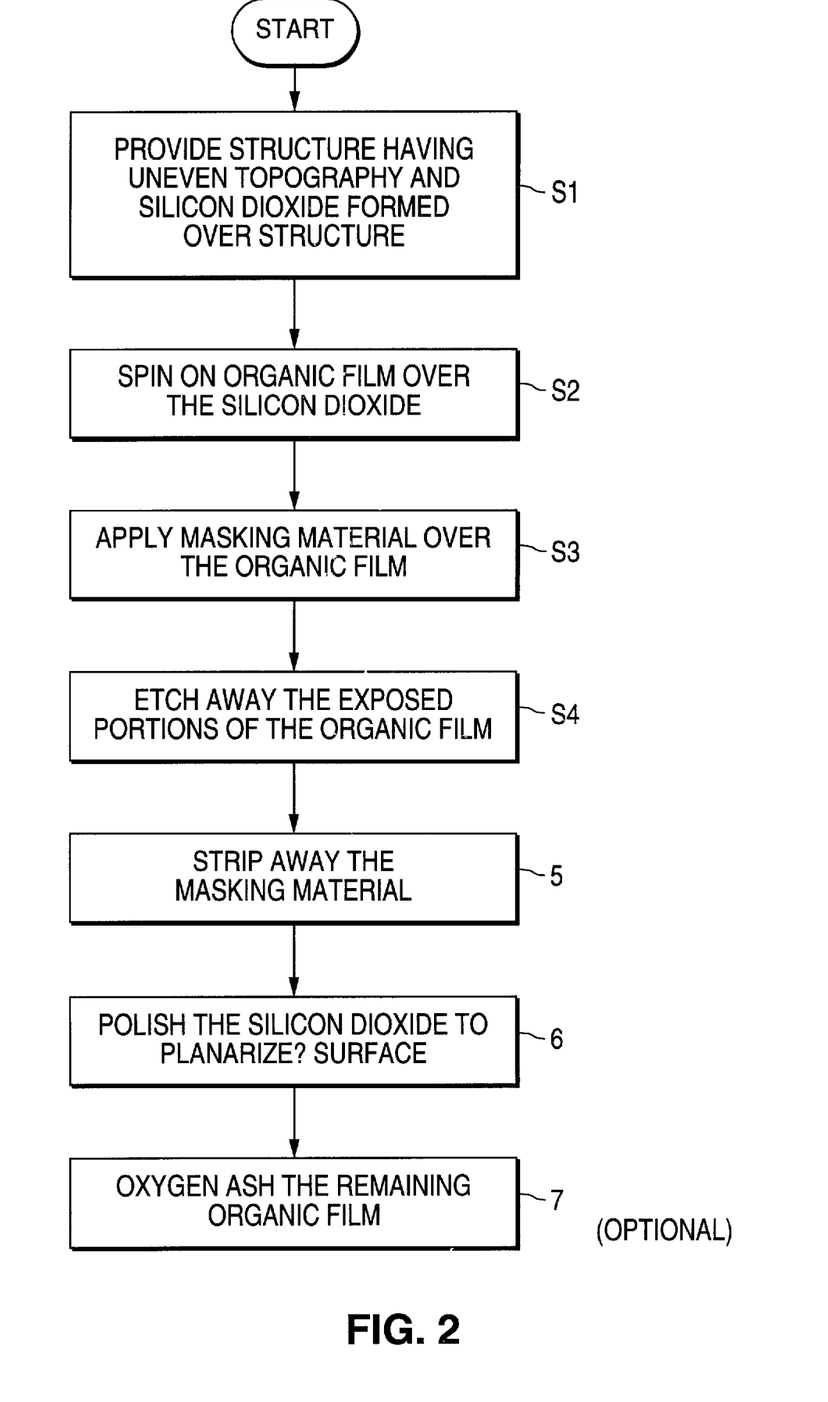
FIG. 2 is a process flow chart for a general planarization process enhanced by an organic material.
Figure 3:
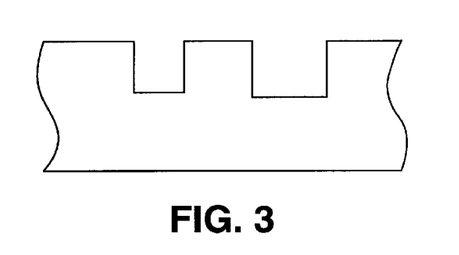
FIG. 3 is a cross-sectional view of a structure having an uneven topography.

FIG. 2 is a process flow chart of a general planarization process enhanced by an organic film, which prevents oxide dishing. In step S1, the process begins with providing a structure having an uneven topography 7 and wherein silicon dioxide is formed over the structure having an uneven topography 7. An organic film is then spun over the silicon dioxide in step S2. In step S3, a patterned masking material is placed over the organic film, wherein the masking material is patterned such that it masks portions of the organic material over areas prone to oxide dishing. In step S4, the exposed portions of the organic film are then etched away, stopping on the silicon dioxide. After the masking material is chemically stripped away in step S5, the remaining surface is polished, in step S6, until the organic film stops the polishing before oxide dishing occurs. Finally, the remaining organic material may then be completely oxygen ashed in step S7, leaving the structure planarized or the organic material may be left as an integral part of the dielectric.

Figure 4:
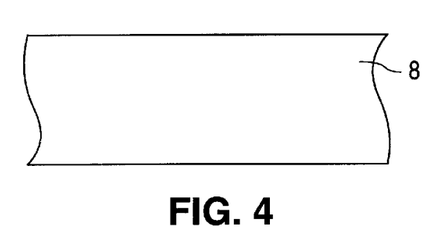
FIGS. 4–13 are cross-sectional views illustrating the process sequence steps in accordance with the concepts of the invention in STI planarization.
Figure 5:
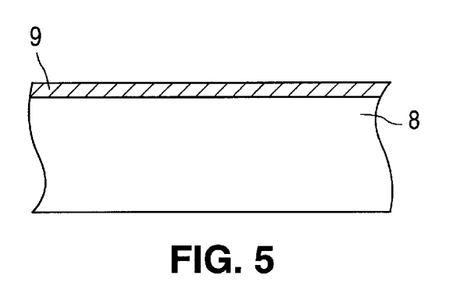

An STI planarization process enhanced by an organic material will be described in detail with reference to FIGS. 4–13. FIG. 4 is a cross-sectional view of a silicon substrate 8. A pad oxide is formed, followed by deposition of a layer of silicon nitride 9 over the silicon substrate 8, as shown in FIG. 5.

Figure 6:
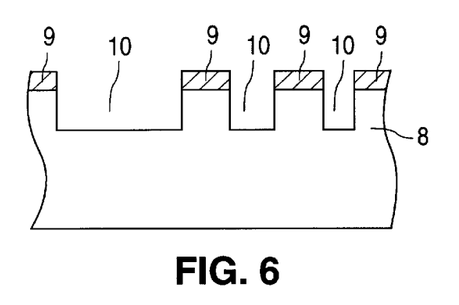

FIG. 6 is a cross-sectional view of the silicon substrate 8 after a silicon trench etch has been performed. The silicon trench etch step leaves trenches 10 in the silicon substrate 8, creating an uneven topography.

Figure 7:
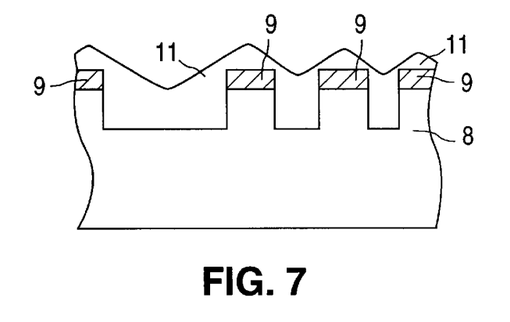

As shown in FIG. 7, the trenches 10 are then filled by a chemical vapor deposition (CVD) gap fill process, such as high density plasma chemical vapor deposition (HDPCVD) trench fill oxide deposition, plasma enhanced chemical vapor deposition (PECVD) trench fill oxide deposition, or Ozone Tetra Ethyl Ortho Silicate (TEOS). The uneven topography causes the oxide 11, which is deposited by the HDPCVD step, to also have an uneven topography, which needs to be planarized.

Figure 8:
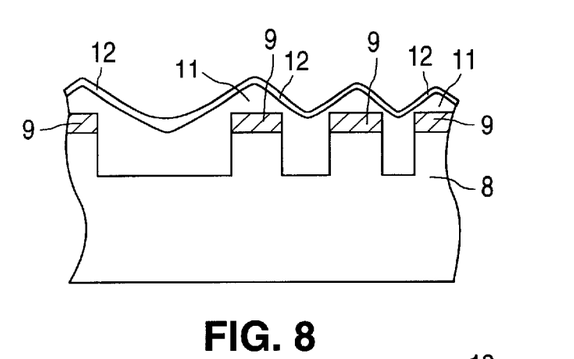

As shown in FIG. 8, a thin layer of organic film 12 is then spun over the oxide 11 to prevent oxide dishing during CMP polishing. The organic film 12 is either applied using conventional spin coating equipment or vapor deposited over the surface. Using either technique, it is preferred that the layer of organic film 12 has a thickness of less than 1000 angstroms. If the layer of organic film 12 is spun, the film is somewhat thicker in the areas over the trenches 10, depending on the size of the trench 10. For vapor deposited films, the coating will be more uniform. The organic film's 12 chemical properties must give it high selectivity to silicon nitride 9 and silicon dioxide 11.

The organic film 12 is preferably an aromatic hydrocarbon polymer, such as PAE polyarylene ether (available from Schumacher Corp.) and FLARE polyarylene ether (available from Allied Signal). Alternatively, the organic film 12 may be an amorphous carbon deposited by chemical vapor deposition (CVD).

In a preferred embodiment, the organic film 12 is either PAE polyarylene ether or FLARE polyarylene ether. The polyarylene ether is applied as an oligomeric solution using conventional spin coating equipment and produces highly uniform films after curing at 400° C. to 450° C. After masking, the exposed polyarylene ether is etched prior to CMP. Polyarylene ether also has an extremely high selectivity to oxide, making it an ideal planarization material for STI planarization or interlevel and intralevel dielectric.

Figure 9:
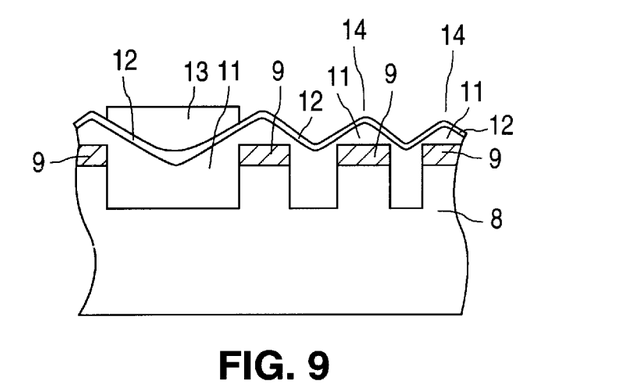
Figure 10:
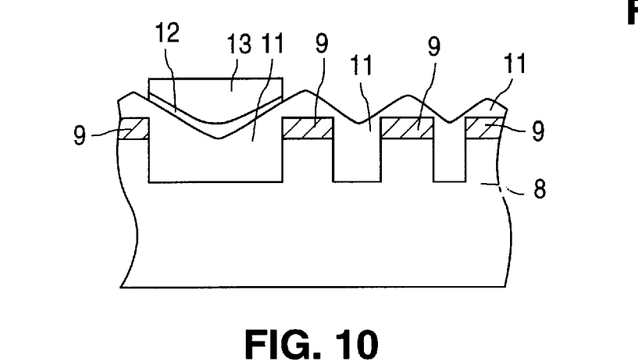

As shown in FIG. 9, a reverse mask 13 having windows 14 is then placed over the organic film 12. The mask 13 is patterned such that it masks areas that are prone to oxide dishing, such as the areas over the trenches 10. The areas over wide trenches are especially prone to dishing. FIG. 10 is a view of the structure after the unmasked portions of the organic film 12 have been etched away through windows 14 in the mask 13.

Figure 11:
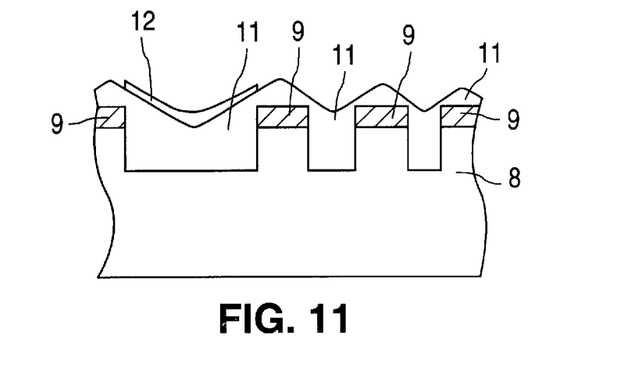
Figure 12:
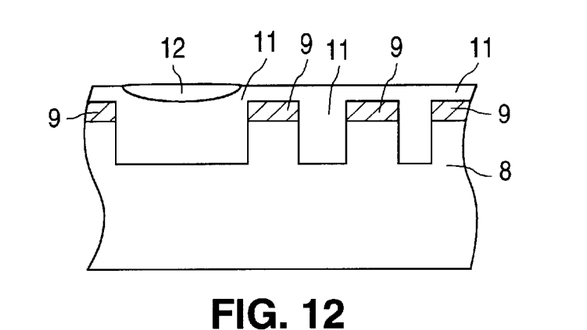

As shown in FIG. 11, the mask 13 is stripped away, leaving exposed surfaces of the organic film 12 and the oxide 11. The mask 13 is stripped with a chemical that does not attack the organic film 12. A suitable stripping chemical is, for example, acetone. FIG. 12 is a cross-sectional view of the structure after CMP planarization has been performed on the oxide 11 to planarize the topography. The organic film 12 enhances the planarization process in that the organic film 12 stops the etching during the CMP planarization step, thereby preventing oxide dishing.

The organic film 12 has almost an infinite selectivity to silicon dioxide in silicon dioxide polish slurry. This high selectivity prevents the organic film 12 from being polished during the CMP step, thereby stopping the etching and preventing oxide dishing.

After the CMP step is completed, the organic film 12 may be removed by completely oxygen ashing the thin layer of organic film 12 if so desired. Alternatively, the organic film 12 may be left on the wafer as part of the subsequent dielectric. Preferably, the organic film 12 is removed in the STI process because the wafer may later be exposed to high temperatures.

Figure 13:
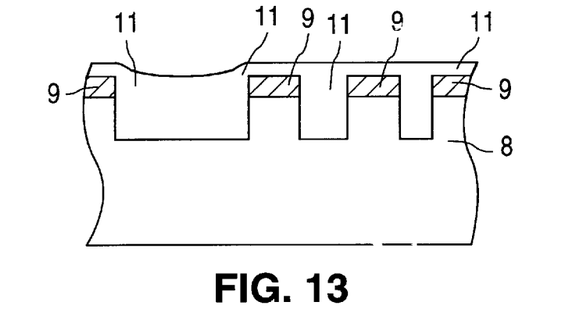

Even after the removal of the organic film 12, the surface of the structure is still substantially planarized because the layer of spun on organic film is so thin. FIG. 13 is a cross-sectional view of the substantially planarized surface after the oxygen ashing step.

A description of a multilevel metalization planarization process enhanced by an organic material will be described with reference to FIGS. 14–21. Metalization is a process of depositing and patterning metal to interconnect various components. In order to increase the number of interconnects to increase chip density, multilayer interconnects are used. A multilayer metal system requires planarization of the substrate surface.

Figure 14:
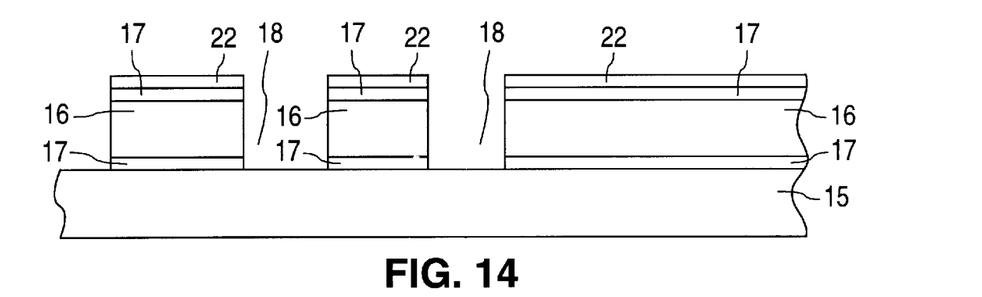
FIGS. 14–21 are cross-sectional views illustrating the process sequence steps in accordance with the concepts of the invention in multilevel metalization planarization.

FIG. 14 is a cross-sectional view of a preferred multilevel metal system deposited over silicon dioxide 15. The multilevel metal system preferably is formed of a layer of aluminum 16 sandwiched between two thin layers of titanium 17 with a layer of titanium nitride 22 on top. The patterning of the multilevel metal creates gaps 18, as shown in FIG. 14. The deposition and patterning of the multilevel metal system creates a surface with an uneven topography.

Figure 15:
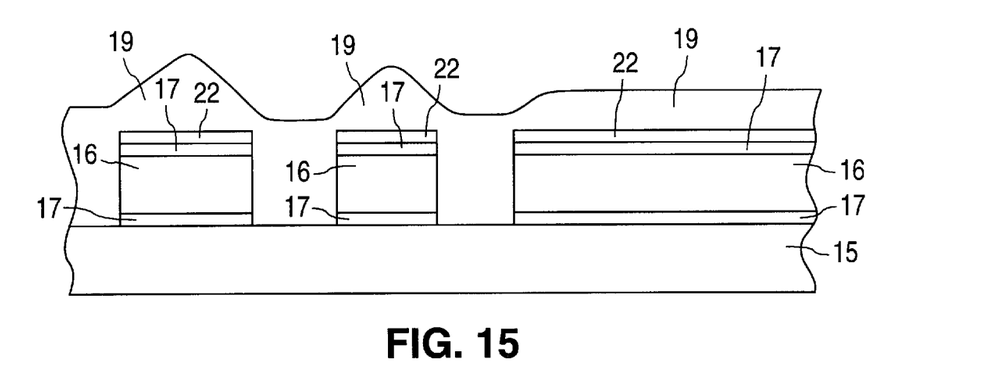
Figure 16:
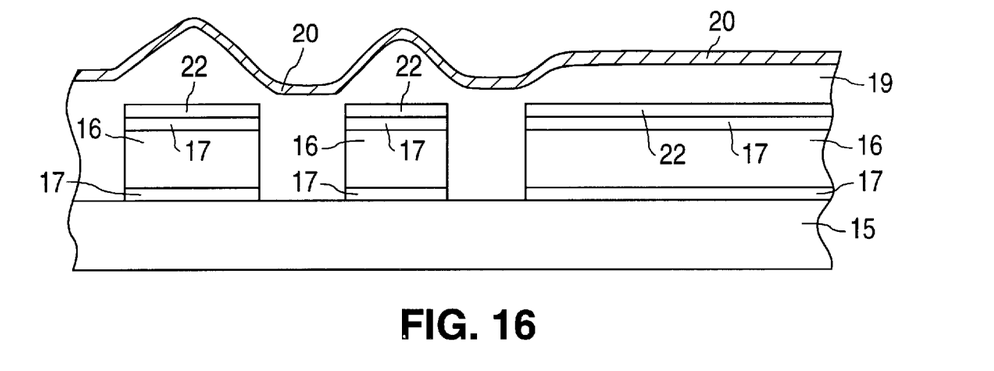

A dielectric, such as silicon dioxide 19, is then deposited over the surface to fill the gaps 18. The uneven topography of the multilevel metal patterning causes the surface of the silicon dioxide 19 to also be uneven, as shown in FIG. 15. A thin layer of organic film 20 of less than 1000 angstroms is then spun over the silicon dioxide, as shown in FIG. 16.

In a preferred embodiment of the multilevel metalization planarization process, the organic film 20 is either PAE polyarylene ether or FLARE polyarylene ether. The polyarylene ether is applied as an oligomeric solution using conventional spin coating equipment and produces highly uniform films after curing at 400° C. to 450° C.

Alternatively, the organic film 20 may be an amorphous carbon, which also has a high selectivity to silicon dioxide. The amorphous carbon is not spun on, but rather deposited by chemical vapor deposition.

Figure 17:
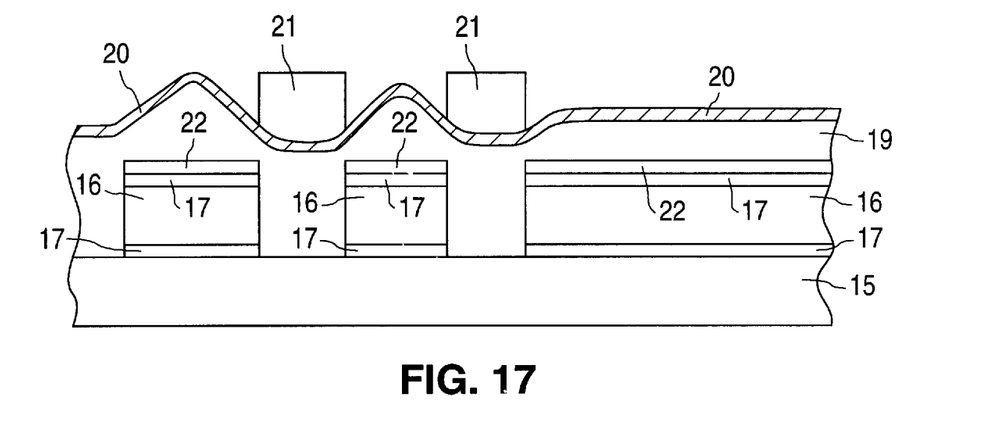

A mask 21 is then applied over the layer of organic film 20. The mask 21 is patterned such that windows in the mask 21 expose the portions of the organic film 20 that are to be etched away. FIG. 17 shows the mask 21 in the areas over the gaps 18 and the windows exposing portions of the organic film 20 that are to be stripped in the next step.

Figure 18:
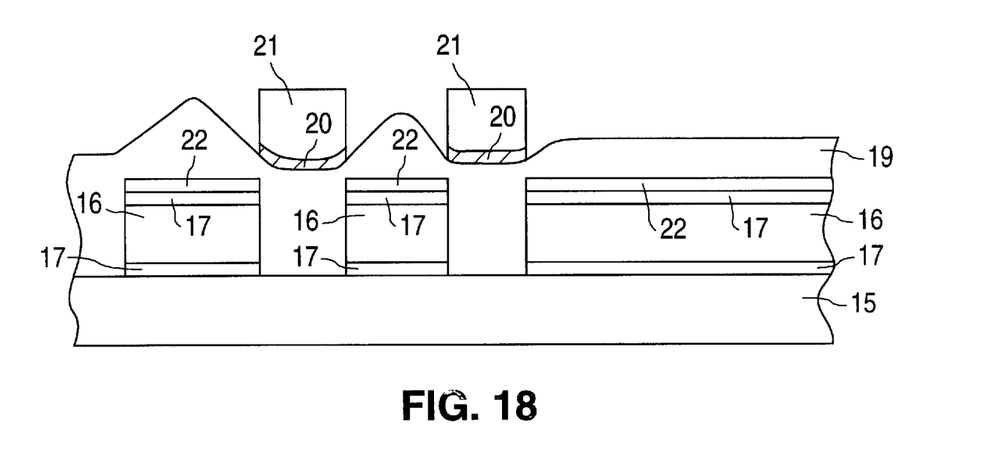
Figure 19:
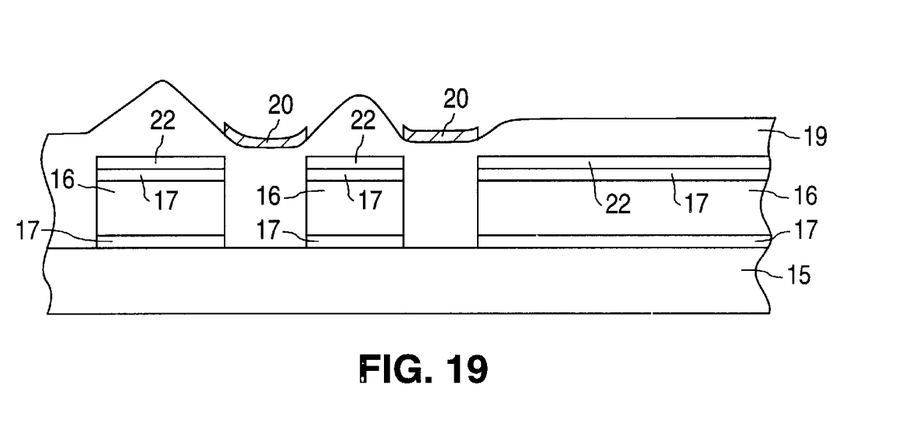

The exposed portions of the organic film 20 are then etched away through the windows in the mask 21, as shown in FIG. 18. The mask 21 is then chemically stripped off. The mask 21 is stripped with a chemical that does not attack the organic film 20. A suitable stripping chemical is, for example, acetone. FIG. 19 is a cross-sectional view of the structure after the mask 21 has been stripped off.

Figure 20:
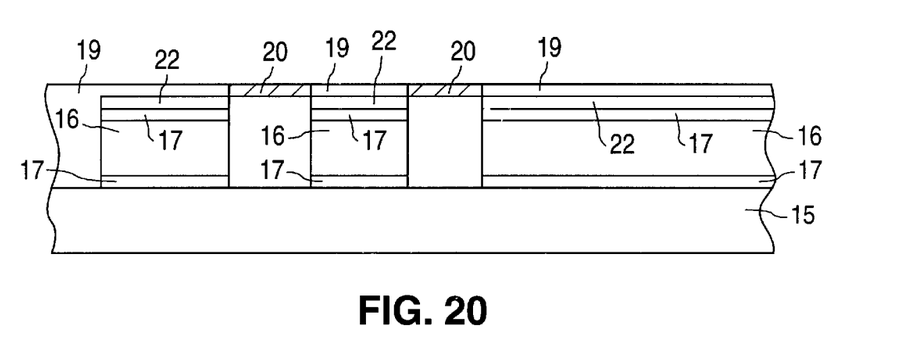

CMP planarization is then performed to planarize the uneven topography of the silicon dioxide 19 surface, as shown in FIG. 20. The high CMP selectivity of the organic film 20 to silicon dioxide 19 stops the etching when the CMP reaches the organic film 20. The CMP thus stops before oxide dishing occurs. The high selectivity of the organic film 20 eliminates the dishing problem in multilevel metalization.

Figure 21:
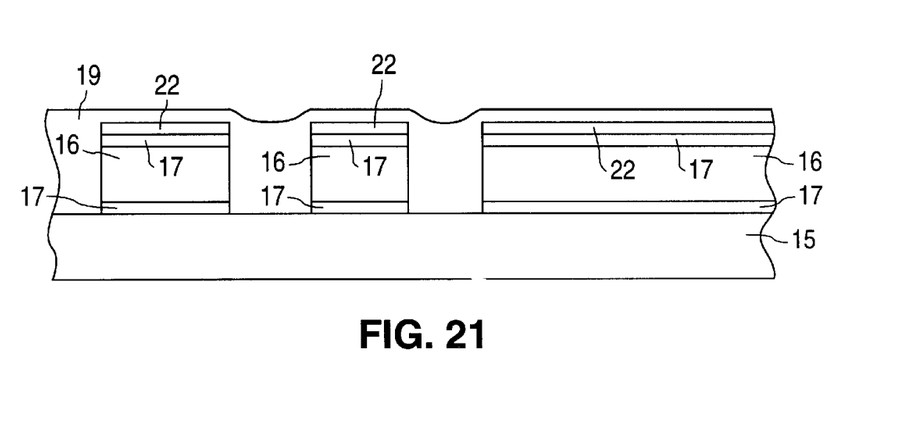

The remaining organic film 20 may then be removed by oxygen ashing if so desired. FIG. 21 is a cross-sectional view of the planarized structure after the organic film 20 has been oxygen ashed.

The present invention may be used to enhance other planarization processes and is not limited to STI planarization and multilevel metalization processes.

What is claimed is:

1. A planarization process for planarizing a structure having an uneven topography and wherein a dielectric material is formed over the structure, comprising the steps of:
   forming a selective material over the dielectric material, the selective material being CMP selective to the dielectric material;
   forming a patterned masking material over the selective material to expose portions of the selective material;
   etching away the exposed portions of the selective material;
   stripping away the masking material; and
   polishing the dielectric material until the selective material stops the polishing.

2. The planarization process of claim 1 wherein the dielectric material is silicon dioxide.

3. The planarization process of claim 1 wherein the selective material is an organic film.

4. The planarization process of claim 1 wherein the polishing step is chemical mechanical polishing.

5. The planarization process of claim 1 further comprising the step of removing the selective material after completion of polishing the dielectric material.

6. The planarization process of claim 3 wherein the organic film is an amorphous carbon.

7. The planarization process of claim 1 wherein the uneven topography is formed by performing a trench etch on the structure.

8. The planarization process of claim 1 wherein the uneven topography is formed by depositing and patterning multilayer metal on the structure.

9. A planarization process for planarizing a structure having an uneven topography and wherein silicon dioxide is formed over the structure, comprising the steps of:
   forming an organic film over the silicon dioxide, the organic film being CMP selective to silicon dioxide;
   forming a patterned masking material over the organic film to expose portions of the organic film;
   etching away the exposed portions of the organic film;
   stripping away the masking material; and
   polishing the silicon dioxide until the organic film stops the polishing.

10. The planarization process of claim 9 wherein the polishing step is chemical mechanical polishing.

11. The planarization process of claim 9 further comprising the step of removing the organic film after completion of the polishing the silicon dioxide.

12. The planarization process of claim 9 wherein the organic film is an amorphous carbon.

13. The planarization process of claim 9 wherein the uneven topography is formed by performing a silicon trench etch on the structure.

14. The planarization process of claim 9 wherein the uneven topography is formed by depositing and patterning multilayer metal on the structure.

15. The planarization process of claim 11 wherein the removal step is performed by oxygen ashing the organic film.

16. A shallow trench isolation planarization process, comprising the steps of:
   providing a silicon substrate;
   forming pad oxide and silicon nitride on the silicon substrate;
   making a trench by performing a silicon trench etch on the silicon nitride, pad oxide, and the silicon substrate;
   filling the trench by depositing trench fill oxide;
   forming an organic film over the trench fill oxide the organic film being CMP selective to silicon dioxide;
   forming a patterned reverse mask over the organic film to expose portions of the organic film;
   etching the exposed portions of the organic film;
   stripping off the mask; and
   polishing the silicon dioxide.

17. The shallow trench isolation planarization process of claim 16 wherein the filling step is high-density plasma chemical vapor deposition trench fill.

18. The shallow trench isolation planarization process of claim 16 wherein the filling step is plasma enhanced chemical vapor deposition trench fill.

19. The shallow trench isolation planarization process of claim 16 wherein the filling step is Ozone Tetra Ethyl Ortho Silicate trench fill.

20. The shallow trench isolation planarization process of claim 16 wherein the organic film is an aromatic hydrocarbon polymer.

21. The shallow trench isolation planarization process of claim 20 wherein the aromatic hydrocarbon polymer is spun on as an oligomeric solution.

22. The shallow trench isolation planarization process of claim 16 wherein the organic film is an amorphous carbon deposited by chemical vapor deposition.

23. The shallow trench isolation planarization process of claim 16 wherein the polishing step is chemical mechanical polishing.

24. The shallow trench isolation planarization process of claim 16 further comprising the step of removing the organic film.

25. The shallow trench isolation planarization process of claim 24 wherein the removal step is performed by oxygen ashing the organic film.

26. A multilevel metalization planarization process, comprising the steps of:
   providing a metal interconnect structure having uneven topography;

forming silicon dioxide over the structure;

forming an organic film over the silicon dioxide;

forming a patterned masking material over the organic film, leaving exposed portions of the organic film;

etching away the exposed portions of the organic film; and polishing the silicon dioxide until the organic film stops the polishing.

27. The multilevel metalization planarization process of claim 26 wherein the organic film is an aromatic hydrocarbon polymer.

28. The multilevel metalization planarization process of claim 26 wherein the polishing step is chemical mechanical polishing.

29. The multilevel metalization planarization process of claim 26 further comprising the step of removing the organic film.

30. The multilevel metalization planarization process of claim 26 wherein the organic film is an amorphous carbon.

31. The multilevel metalization planarization process of claim 29 wherein the removal step is oxygen ashing.

32. A multilevel metalization planarization process, comprising the steps of:

providing a silicon surface;

creating an uneven topography on the silicon surface by depositing and patterning multilayer metal;

forming a layer of silicon dioxide over the uneven topography;

spinning on an aromatic hydrocarbon polymer over the silicon dioxide;

forming a mask over the aromatic hydrocarbon polymer, the mask being patterned such that portions of the aromatic hydrocarbon polymer are exposed and portions of the aromatic hydrocarbon polymer are masked;

etching away the exposed portions of the aromatic hydrocarbon polymer;

chemically stripping off the reverse mask;

chemical mechanical polishing the silicon dioxide until the polishing is stopped by the aromatic hydrocarbon polymer; and removing the aromatic hydrocarbon polymer by oxygen ashing the aromatic hydrocarbon polymer.

33. The multilevel metalization planarization process of claim 32 wherein the masked portions of the aromatic hydrocarbon polymer are over areas that are prone to oxide dishing.

34. A method of planarizing a structure having an uneven topography and wherein a dielectric material is formed over the structure, the method comprising:

forming an aromatic hydrocarbon polymer film over the dielectric material, the aromatic hydrocarbon polymer film being CMP selective to the dielectric material;

forming a patterned masking material over the aromatic hydrocarbon polymer film to expose portions of the aromatic hydrocarbon polymer film;

etching away the exposed portions of the aromatic hydrocarbon polymer film;

stripping away the masking material; and polishing the dielectric material until the aromatic hydrocarbon polymer film stops the polishing.

35. The method of claim 34, and wherein the dielectric material is silicon dioxide.

36. The method of claim 34, and wherein the polishing step is chemical mechanical polishing.

37. The method of claims 34, and further comprising the step of removing the aromatic hydrocarbon polymer film after completion of polishing the dielectric material.

38. The method of claim 34, and wherein the aromatic hydrocarbon polymer comprise polyarylene ether.

39. The method of claim 1 wherein the uneven topography is formed by performing a trench etch on the structure.

40. The method of claim 9, and wherein the uneven topography is formed by depositing and patterning multilayer metal on the structure.

41. A method of planarizing a structure having an uneven topography and wherein silicon dioxide is formed over the structure, the method comprising:

forming an aromatic hydrocarbon polymer film over the silicon dioxide, the aromatic hydrocarbon polymer film being CMP selective to silicon dioxide;

forming a patterned masking material over the aromatic hydrocarbon polymer film to expose portions of the aromatic hydrocarbon polymer film;

etching away the exposed portions of the aromatic hydrocarbon polymer film;

stripping away the masking material; and polishing the silicon dioxide until the aromatic hydrocarbon polymer film stops the polishing.

42. The method of claim 41, and wherein the polishing step is chemical mechanical polishing.

43. The method of claim 41, and further comprising the step of removing the aromatic hydrocarbon polymer film after completion of the polishing the silicon dioxide.

44. The method of claim 41, and wherein the aromatic hydrocarbon polymer is selected from the group consisting of PAE polyarylene ether and FLARE polyarylene ether.

45. The method of claim 41, and wherein the uneven topography is formed by performing a silicon trench etch on the structure.

46. The method of claim 41, and wherein the uneven topography is formed by depositing and patterning multilayer metal on the structure.

47. The method of claim 43, and wherein the removal step is performed by oxygen ashing the aromatic hydrocarbon polymer film.

48. The shallow trench isolation planarization process of claim 20 wherein the aromatic hydrocarbon polymer comprises polyarylene ether.

49. The multilevel metalization planarization process of claim 27 wherein the aromatic hydrocarbon polymer comprises polyarylene ether.

50. The multilevel metalization planarization process of claim 32 wherein the aromatic hydrocarbon polymer comprises polyarylene either.

* * * * *